(12) United States Patent
Shibata

(10) Patent No.: US 7,575,942 B2
(45) Date of Patent: Aug. 18, 2009

(54) EPITAXIAL SUBSTRATE, SEMICONDUCTOR ELEMENT, MANUFACTURING METHOD FOR EPITAXIAL SUBSTRATE AND METHOD FOR UNEVENLY DISTRIBUTING DISLOCATIONS IN GROUP III NITRIDE CRYSTAL

(75) Inventor: Tomohiko Shibata, Aichi (JP)

(73) Assignee: NGK Insulators, Ltd., Nagoya (JP)

( * ) Notice: Subject to any disclaimer, the term of this patent is extended or adjusted under 35 U.S.C. 154(b) by 215 days.

(21) Appl. No.: 11/417,936

(22) Filed: May 4, 2006

(65) Prior Publication Data

US 2006/0255363 A1 Nov. 16, 2006

(30) Foreign Application Priority Data

May 12, 2005 (JP) ............................. 2005-139769

(51) Int. Cl.
*H01L 21/00* (2006.01)
*H01L 29/93* (2006.01)

(52) U.S. Cl. ................. 438/22; 257/592; 257/E33.005; 257/E21.09; 257/E21.092

(58) Field of Classification Search ................. 257/628, 257/592, E33.005, E21.09, E21.092; 438/22, 438/41, 222, 226, 357, 363, 416, 442
See application file for complete search history.

(56) References Cited

U.S. PATENT DOCUMENTS 6,586,819 B2 * 7/2003 Matsuoka ................... 257/628
6,924,159 B2 * 8/2005 Usui et al. ..................... 438/22
7,189,588 B2 * 3/2007 Usui et al. ..................... 438/22

FOREIGN PATENT DOCUMENTS

JP 3427047 5/2003

OTHER PUBLICATIONS

Akira Sakai and Akira Usui, "Reduction of dislocation density in GaN films by epitaxial lateral overgrowth,", "Oyo Buturi," The Japan Society of Applied Physics, vol. 68, No. 7, pp. 774-779 (1999) and English Language Abstract.

* cited by examiner

*Primary Examiner*—Davienne Monbleau
*Assistant Examiner*—Monica D Harrison
(74) *Attorney, Agent, or Firm*—Burr & Brown

(57) ABSTRACT

An epitaxial substrate used to generate a group III nitride crystal having excellent crystal quality. An upper layer of a group III nitride is formed on a sapphire base with an off angle, and after that a heating process is performed at a temperature not lower than 1500° C., and thereby, the crystal quality of the upper layer is improved and repeating steps of which the size is greater than the height of several atomic layers are provided on the surface of the upper layer. The obtained epitaxial substrate is used as a base substrate for growing a group III nitride crystal layer. The group III nitride crystal grows in a manner of step flow, and therefore, threading dislocations from the upper layer are bent according to this growth, and are unevenly distributed as the crystal grows afterwards.

7 Claims, 2 Drawing Sheets

US 7,575,942 B2

EPITAXIAL SUBSTRATE, SEMICONDUCTOR ELEMENT, MANUFACTURING METHOD FOR EPITAXIAL SUBSTRATE AND METHOD FOR UNEVENLY DISTRIBUTING DISLOCATIONS IN GROUP III NITRIDE CRYSTAL

BACKGROUND OF THE INVENTION

1. Field of the Invention

The present invention relates to a technology for fabricating an epitaxial substrate which is appropriate for the generation of a group III nitride crystal having excellent crystal quality.

2. Description of the Background Art

A group-III nitride crystal has been used as a material constituting a semiconductor device such as a photonic device and an electronic device, and has gained the spotlight in recent years as a semiconductor material constituting a rapid IC chip for use in a portable telephone. In particular, an AlN film has received attention as a material for application to a field emitter.

For such device applications, a group-III nitride crystal is ideally provided as free-standing one. Under the current circumstances, however, a group-III nitride crystal is typically provided in the form of a so-called epitaxial substrate such that the group-III nitride crystal having a thickness of the order, at most, of 10 μm (to such a degree that no warpage resulting from a difference in coefficient of thermal expansion occurs) is epitaxially formed on a predetermined single crystal base because of problems with crystal quality, manufacturing costs and the like. In general, thin film formation methods such as an MOCVD (metal-organic chemical vapor deposition) process and an MBE (molecular beam epitaxy) process are used to form such an epitaxial substrate.

In the epitaxial substrate having such a construction, however, a difference in lattice constant exists between the base and the group-III nitride crystal to give rise to dislocations resulting from such a lattice mismatch at an interface therebetween. Such dislocations thread through the group-III nitride film serving as a device functional layer, and most of the dislocations propagate to the surface thereof. To attain good device characteristics, there is a need to minimize the dislocations propagating to the device functional layer.

An ELO process has been proposed to improve the crystal quality resulting from the lattice mismatch between the base and the group-III nitride crystal. See, for example, Akira Sakai and Akira Usui, "Reduction of dislocation density in GaN films by epitaxial lateral overgrowth," "OYO BUTURI," The Japan Society of Applied Physics, Vol. 68, No. 7, pp. 774-779 (1999). The process utilizes an epitaxial lateral overgrowth technique using a mask and the like to reduce a dislocation density.

In addition, a technology for achieving reduction in dislocations in a GaN layer by polishing the surface of the base layer so that steps are formed on an atomic scale, and then, growing the GaN layer is well-known (as disclosed, for example, in Japanese Patent No. 3427047).

It is necessary to improve the crystal quality as much as possible in order to increase the performance of a functional device when a group-III nitride crystal is formed on a base for the function as the functional device. For instance, it is necessary to minimize the dislocation density. The reduction in dislocation density promises to achieve, for example, an increase in light emitting efficiency for a light-emitting device, a decrease in dark current for a photodetector device, and an increase in mobility for an electronic device.

However, although a technique disclosed in the above-mentioned non-patent literature "OYO BUTURI" can reduce dislocations of a group-III nitride crystal, there has been a problem that a step for the formation of a mask is needed.

Furthermore, when forming a device with use of the technique disclosed in the Japanese Patent No. 3427047, as a greater off angle is provided to an underlayer, more specifically, as a larger step is provided to the underlayer, crystalline of a device layer (specifically GaN) formed on the underlayer becomes improved, however, it may cause an undesirable situation in which a step resulting from the step of the underlayer exists on an upper surface of the device layer and the deterioration of device characteristics is produced. Moreover, when forming a device layer containing AlN, there is also a problem that a pit readily occurs on a surface of the device layer.

SUMMARY OF THE INVENTION

The present invention relates to an epitaxial substrate which is appropriate for the generation of a group III nitride crystal, as well as a technology for fabricating the same.

An epitaxial substrate of the present invention is provided with: a base with a predetermined off angle on a main surface; and an upper layer made of a first group III nitride crystal and formed on the main surface at a predetermined temperature for formation, wherein the epitaxial substrate is processed through heating at a heating temperature which is higher than the temperature for formation after the formation of the upper layer.

The heating process is performed so that an epitaxial substrate where the crystal quality of the upper layer is improved and which has repeating steps that are not smaller than the height of several atomic layers is obtained on the surface of the upper layer. When this epitaxial substrate is used as the base substrate for growing a group III nitride crystal layer, a group III nitride crystal layer having excellent surface flatness where the most part in the vicinity of the surface become regions with few dislocations is obtained. That is, it can be said that this epitaxial substrate is appropriate for the formation of a group III nitride crystal having excellent crystal quality.

Preferably, this epitaxial substrate is formed in such a manner that the first group-III nitride crystal has an Al content of not less than 80 mole percent of all of the group-III elements.

As a result, the occurrence of cracking when a group III nitride crystal layer containing Al is grown on the epitaxial substrate is be suppressed. In the case where a light emitting device is formed, transparency is secured even in a short wavelength range.

Accordingly, an object of the present invention is to provide an epitaxial substrate which is appropriate for the generation of a group III nitride crystal having excellent crystal quality.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
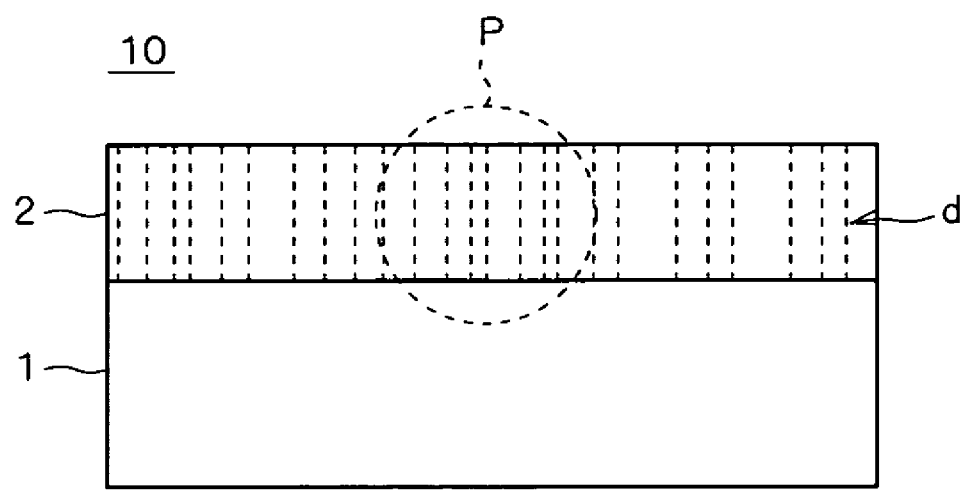
FIG. 1 is a schematic cross sectional diagram of an epitaxial substrate.
Figure 2:
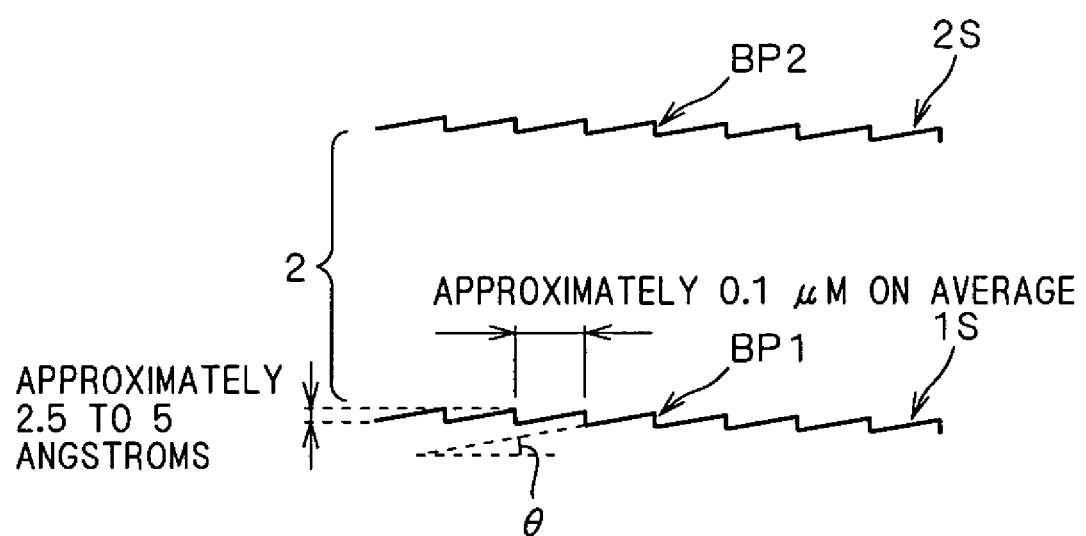
FIG. 2 is an enlarged schematic diagram of the epitaxial substrate.

FIG. 1 is a schematic cross sectional diagram of an epitaxial substrate 10 according to a preferred embodiment of the present invention. In addition, FIG. 2 is an enlarged schematic diagram of a portion P surrounded by a dotted line of the epitaxial substrate 10 in FIG. 1. Here, for the convenience of illustration the thickness ratio of the respective layers and the aspect ratio in FIGS. 1 and 2 do not reflect the actual ratios. The epitaxial substrate 10 is mainly formed of a base 1 and an upper layer 2. The epitaxial substrate 10 is the same as those which are mainly used as a base substrate when a variety of electronic devices are fabricated of a group III nitride semiconductor.

The material of the base 1 is appropriately selected in accordance with the composition and structure of the upper layer 2 to be formed thereon or the technique of forming the upper layer 2 and layers to be formed on the upper layer 2. For example, a substrate of SiC (silicon carbide) or sapphire is used as the base 1. Alternatively, the material of the base 1 may be appropriately selected from the group consisting of: oxide materials such as ZnO, $LiAlO_2$, $LiGaO_2$, $MgAl_2O_4$, $(LaSr)(AlTa)O_3$, $NdGaO_3$ and MgO; group-IV single crystals such as Si and Ge; IV-IV compounds such as SiGe; III-V compounds such as GaAs, AlN, GaN and AlGaN; and single crystals of borides such as $ZrB_2$. Of these materials, for example, (0001) SiC, or (11-20) and (0001) sapphire may be used as the material of the base 1 when a group-III nitride crystal having a main surface coincident with the (0001) plane thereof is provided as the upper layer 2. For example, (11-20) SiC or (10-12) sapphire may be used as the material of the base 1 when a group-III nitride crystal having a main surface coincident with the (11-20) plane thereof is provided as the upper layer 2. There are no special material limitations on the thickness of the base 1, but the base 1 having a thickness ranging from hundreds of micrometers to several millimeters is preferable for convenience of handling.

The upper layer 2 is formed on a base 1 made of a single crystal material different in composition from the group-III nitride crystal. The upper layer 2 is an epitaxial film made of the group-III nitride crystal and formed by a known deposition technique such as an MOCVD process, an MBE process, an HVPE process (a vapor-phase epitaxy process using hydride), and a sputtering process. The MOCVD process may be used in combination with a PALE (Pulsed Atomic Layer Epitaxy) process, a plasma assisted process or a laser assisted process. The MBE process may also be used in combination with similar techniques. The growth methods such as the MOCVD process and the MBE process, which are capable of controlling the manufacturing conditions with high accuracy, are suitable for the growth of a high-quality crystal. The HVPE process, on the other hand, is suitable for the growth of a thick film in a short time because this process can supply a large amount of raw material at a time. These processes may be combined together during the formation of the upper layer 2.

In general, the upper layer 2 contains dislocations having a density of about $1 \times 10^9 / cm^2$ or higher. For the group-III nitride crystal, there can be two types of dislocations: screw dislocations and edge dislocations. The edge dislocations are principally present in the upper layer 2. Dislocations d are schematically showed by dotted lines in FIG. 1. The group-III nitride crystal refers to a crystal with a composition represented by $B_xAl_yGa_zIn_{1-x-y-z}N$ (where x, y, z≧0) and having a wurtzite structure or a zincblende structure. It is particularly desirable that the group III nitride crystal has a wurtzite structure. This is because a wurtzite structure is stable for the group III nitride crystal so that the below described problem with the phase transformation during a heating process at a high temperature is not raised.

Preferably, not less than 80 mole percent of all the group III elements in the group III nitride crystal which forms the upper layer 2 is Al. More preferably this group III nitride crystal is AlN. The use of AlN as the group-III nitride is most desirable in the light of quality management because AlN presents no problems of variations resulting from compositional inhomogeneity and the like. It is, however, ascertained that the group-III nitride having an Al content of not less than 80 mole percent of all of the group-III elements produces a similar crystal quality improvement effect in the heating process at the same temperature as the heating process for AlN. Also, such a group-III nitride provides the quality of the upper layer 2 before the heating process which is substantially identical with the quality obtained when AlN is used. If the group-III nitride having an Al content of less than 80 mole percent of all of the group-III elements is subjected to the heating process at the same temperature as the heating process for AlN, there arises a problem that the evaporation of other group-III elements, for example a Ga component, creates pits to impair the surface flatness in some cases.

In addition, when another group III nitride crystal is grown on the upper layer 2, there is an advantage that the occurrence of cracking is suppressed if the lattice constant of the another group III nitride crystal within the main surface is great in comparison with that of the upper layer 2. In particular, in the case where the upper layer 2 is formed of AlN, the occurrence of cracking is suppressed for the group III nitride crystal having whatever composition and grown on the epitaxial substrate 10. In addition, transparency can be confirmed even in a short wavelength range in the case where a light emitting device is formed. In the case where not less than 80 mole percent of all the group III elements in the group III nitride crystal which forms the upper layer 2 is Al, the same effects can be actually obtained.

The thickness of the upper layer 2 is not particularly limited as long as the effects in the below described heating process are obtained, and an optimal thickness for the device structure or the application finally used may be selected. A film thickness of several nm to several mm, for example, is presumed. Under this presumption, in order to form approximately periodic steps which relate to the effects of the below described heating process, it is desirable for the thickness of the upper layer 2 to be secured in such a manner that atomic steps are clearly observed on the surface of the upper layer 2 before heating. In this case, though the lower limit value of the thickness thereof differs depending on the type of the base 1, it is presumed that a film thickness not less than 0.1 μm is required. In addition, the composition of the upper layer 2 illustrated herein is an average composition, and need not always be throughout homogeneous. For example, a gradually varying composition may be employed as the composition of the upper layer 2 or a stress relaxation layer having a different composition may be inserted into the upper layer 2.

Impurities such as H, C, O, Si and transition metals inevitably contained in the upper layer 2 during the formation of the upper layer 2 are sometimes present in the upper layer 2. The upper layer 2 may contain impurities such as Si, Ge, Be, Mg, Zn and Cd intentionally introduced into the upper layer 2 for the purpose of electrical conductivity control.

In addition, when the upper layer 2 is formed as an epitaxial layer made of a group-III nitride having a main surface coincident with the (0001) plane thereof, the effect of reducing the number of dislocations is remarkably produced, and such flatness that an atomic step can be observed is achieved at the surface of the epitaxial substrate 10 after the heat treatment. The use of (0001) sapphire, (11-20) sapphire and (0001) SiC as the material of the base 1 is preferable to form the upper layer 2 as the epitaxial film having such a main surface. In such cases, substrates with the above-mentioned planes slightly inclined from the main surfaces thereof may be used.

In particular, when an AlN epitaxial film having a main surface coincident with the (0001) plane thereof is used as the upper layer 2, the FWHM (full width at half maximum) for the (0002) plane by X-ray rocking curve measurement (ω scan) for the upper layer 2 before the heat treatment is preferably not more than 200 seconds, and more preferably not more than 100 seconds. The lower limit of the FWHM for the (0002) plane by the X-ray rocking curve measurement (ω scan) is not particularly determined, but does not fall below a theoretical value (10 seconds or lower) calculated from the material and crystal structure. The attainment of such an FWHM means small fluctuations in growth orientation, aligned C planes and reduced dislocations of spiral components at the surface of the upper layer 2. This is more preferable in forming a second group-III nitride crystal of good crystal quality on the upper layer 2. To attain the above-mentioned X-ray rocking curve FWHM, it is not desirable to insert a so-called low-temperature buffer layer on the base 1, but the insertion of a low-temperature buffer layer too thin to degrade the crystal quality is permitted.

When the AlN epitaxial film having the main surface coincident with the (0001) plane thereof is used as the upper layer 2, it is desirable that the edge dislocation density in the upper layer 2 before the heat treatment be not more than $5 \times 10^{10}/cm^2$ which is a lower value for the AlN epitaxial film. In this preferred embodiment, the dislocation density is evaluated by using plan view TEM. The formation of a nitride layer on the surface of the base 1 reduces the dislocation density of AlN before the heat treatment to the lower value as described above. This is because the reduction in the dislocation density before the heat treatment achieves the faster and more effective improvement in crystal quality by the heat treatment. Depending on the condition settings, the dislocation density of the upper layer 2 before the heat treatment may be reduced to about $1 \times 10^9/cm^2$.

The MOCVD process or the MBE process in which a growth rate is several micrometers per hour at the most can be said to be a preferable technique for forming the AlN epitaxial film having the main surface coincident with the (0001) plane thereof with such crystal quality as the upper layer 2. In this case, the thickness of the upper layer 2 is preferably not more than 10 μm, more preferably not more than 3 μm, considering the efficiency of growth time and the like. To form the upper layer 2 as described above in particular by the MOCVD process using trimethylaluminum and ammonia, it is desirable that the temperature of the substrate itself be not less than 1100° C. This is because a state closer to a state of equilibrium is achieved by reducing the growth rate to a low value and raising the temperature of the substrate itself. A reduced-pressure atmosphere is used in which the pressure during the growth is not less than 1 Torr, preferably not more than 100 Torr, more preferably not more than 20 Torr. It is also desirable that a supply ratio between trimethylaluminum and ammonia be not more than 1:500, more preferably not more than 1:200. This can efficiently suppress the reactions of raw materials in a vapor phase.

The crystal structure of AlN constituting the upper layer 2 and taking on a wurtzite structure as described above has no center of symmetry, and the orientation of the crystal of such AlN is reversed if an Al atom and a nitride atom change their places. In other words, the crystal has a polarity dependent on the arrangement of atoms. If inversion domains which are regions different in polarity from each other are present in the surface of the upper layer 2, the boundary of the inversion domains (an inversion domain boundary) functions as a kind of plane defect. In this case, there is a possibility that a defect resulting from this plane defect occurs after the heat treatment, which is undesired. Thus, the surface of the upper layer 2 preferably has the same polarity throughout.

In addition, as shown in FIG. 2, in the preferred embodiment, a base 1 in a state where a so-called off angle θ is provided to a main surface 1S is used when an epitaxial substrate 10 is formed as described above. This state is exemplified by the case where the (0001) plane of the base 1 is inclined by the off angle θ on the main surface 1S. Specifically, the base 1 in this state has, on the main surface 1S, repeatedly formed microscopic steps BP1 of which the average interval is approximately 0.1 μm and the height approximately 2 to 10 angstroms (FIG. 2 shows a case of approximately 2 to 5 angstroms). Such height is approximately the same as that of three atomic layers. This off angle allows microscopic steps BP2, which are approximately the same as the steps BP1 on the main surface 1S of the base 1, to be repeatedly and approximately periodically formed on the main surface 2S of the upper layer 2, as shown in FIG. 2. Here, when the off angle θ is small, it may be considered that the crystal plane that forms the main surface if there is no off angle θ substantially forms the main surface 2S of the upper layer 2. In the case where the main surface 1S of the base 1 is in such a state that the (0001) plane is inclined by the off angle θ, for example, it can be said that the main surface 2S of the upper layer 2 substantially consists of (0001) plane.

Here, in some cases, steps BP1 may not be clearly seen even when the off angle θ is provided, depending on the content of the processes which are carried out on the base 1 prior to the formation of the upper layer 2, but in this case, microscopic steps BP2 are formed on the main surface 2S of the upper layer 2, in the same manner as in the above.

Furthermore, in the preferred embodiment, the epitaxial substrate 10 is not provided as it is for the formation of a variety of device layers having a group III nitride crystal, but prior to being provided, a predetermined heat treatment is once carried out on the epitaxial substrate 10. Concretely, the epitaxial substrate 10 is heated to at least not lower than 1500° C., preferably not lower than 1600° C., using a predetermined heat treatment apparatus. The upper limit of the temperature for heating with the heat treatment apparatus is not particularly limited. However, if the temperature for heating is too high, the base 1 and the upper layer 2 may react with each other, greatly deteriorating the crystal quality, depending on the combination of the base 1 and the upper layer 2. Accordingly, it is desirable to set the upper limit temperature within a range where no excessive reaction occurs between the base 1 and the upper layer 2. Here, an appropriate time for heating is set on the basis of the used heat treatment apparatus and other factors, and is, for example, approximately several tens of hours.

FIGS. 3A to 3D are schematic cross sectional diagrams showing the growing process of a group III nitride crystal in the case where an epitaxial substrate 10 is used as the base substrate after a heating process has been carried out as described above. The group III nitride crystal is formed in accordance with a well-known technique for film formation, such as, for example, an MOCVD process, an MBE process, an HVPE process or a sputtering process, in the same manner as the upper layer 2.

Figure 3A:
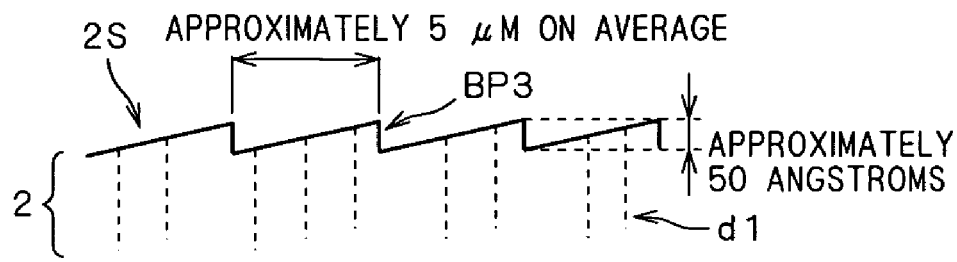
FIGS. 3A to 3D are schematic cross sectional diagrams showing the growing process of a group III nitride crystal.

First, FIG. 3A is a diagram showing the state before growing of a crystal, that is, the epitaxial substrate 10 after a heating process has been carried out. By carrying out a heating process, steps BP3 are formed on the main surface 2S of the upper layer 2, as shown in FIG. 3A. The average interval of steps BP3 is approximately 5 μm and the height of them is not less than the height of three atomic layers preferably not smaller than 20 angstroms (FIGS. 3A to 3D show a case of approximately 50 angstroms), and which are significantly large in comparison with those before processing. In particular, in the case where atomic steps can be clearly seen on the main surface 2S of the upper layer 2 before the heating process, steps BP3 are repeatedly and approximately periodically formed. This can be interpreted as meaning that steps grow during the heating process. Here, this heating process is a type of annealing process, and therefore, improvement in the crystal quality, such as improvement in the crystallinity in the upper layer 2 and reduction of dislocations d1, can be achieved at the same time.

It is characteristic that the above-mentioned reduction of dislocations d1 is found not only in a surface portion of the upper layer 2 but also in a nearby area about 0.01 μm from the interface of the base 1 and the upper layer 2 to the same degree as in the surface portion. This results from the fact that a plurality of edge dislocations near the interface with the substrate are combined together to disappear by the heat treatment. This stands in contrast to the gradual decrease in dislocation density of the AlN epitaxial film serving as the upper layer 2 with the increasing thickness in the case where the improvement method according to the preferred embodiment is not used.

Here, the temperature for heating is at least not lower than 1500° C., because steps BP3 can be formed within a practical heating time. At a temperature lower than 1500° C., a heating process for approximately several tens of hours is not enough to form steps BP3 on the surface.

In addition, the temperature for heating is not lower than 1600° C., so that the density of dislocations in the upper layer 2 can further be lowered.

That is, in the preferred embodiment, an epitaxial substrate 10 of which the crystal quality is improved during the heating process as described above and which has significantly large steps on the surface of the upper layer 2 is used as the base substrate for growing a group III nitride crystal layer 3.

Figure 3B:
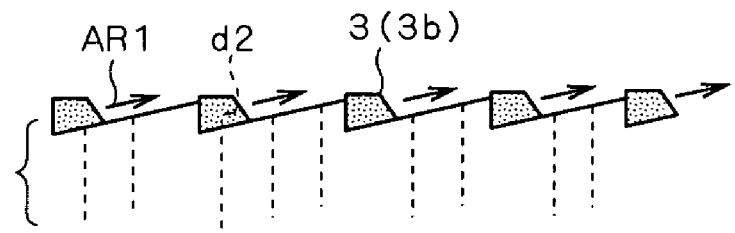

FIG. 3B is a diagram schematically showing the appearance of the group III nitride crystal layer 3 at an initial stage of growth. At this stage, the group III nitride crystal 3b grows from the points of individual steps BP3, mainly in approximately the horizontal direction, indicated by arrow AR1, but grows also in the vertical direction. That is, at this stage, the selective growth in the horizontal direction which is so-called step flow growth is occured. At this time, dislocations d1 which exist in the upper layer 2 grow toward the group III nitride crystal 3b. But according to the growth of the group III nitride crystal 3b approximately in the horizontal direction, threading dislocations d2 which run through the group III nitride crystal 3b is bent so as to extend approximately in the horizontal direction.

Figure 3C:
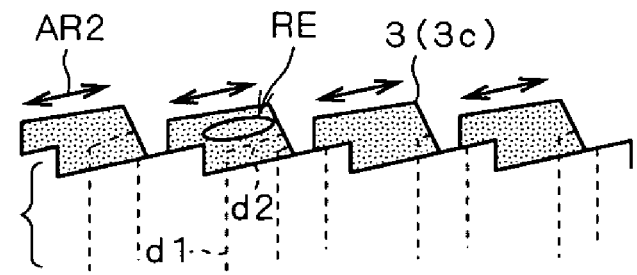

FIG. 3C is a diagram schematically showing the appearance of the crystal at a middle stage of the growth. At this stage, the group III nitride crystal 3c is formed over the individual steps BP3, as viewed in the vertical direction, and thus, the crystal mainly grows approximately in the two horizontal directions, indicated by arrow A2. As a result, the individual group III nitride crystals 3c which independently grow in the shown state finally make contact with each other. Here, at this stage, dislocations d2 expand in a bent state. That is, expansion of threading dislocations d2 in the vertical direction is blocked by the selective crystal growth, so that low dislocation regions RE threading dislocations do not exist comes to be formed above the group III nitride crystal 3c.

Figure 3D:
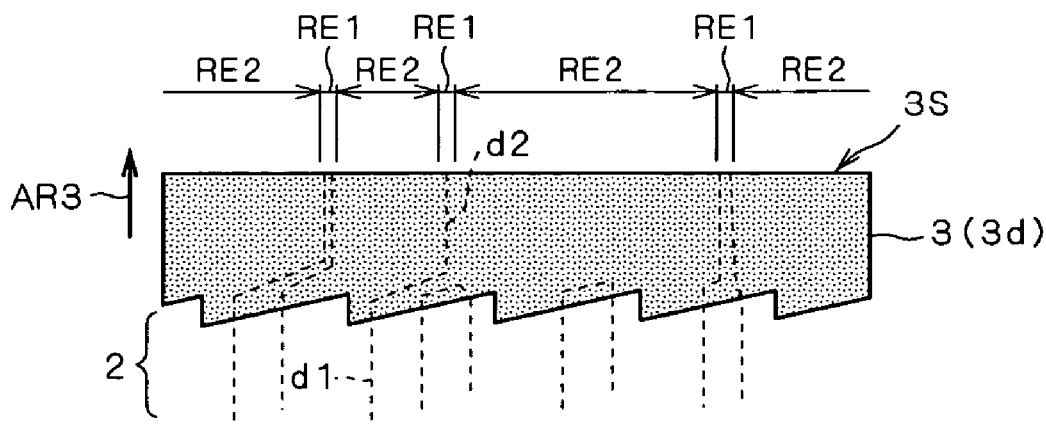

FIG. 3D is a diagram schematically showing the appearance at a later stage of growth, after the crystals make contact with each other. At this stage, the group III nitride crystal 3d no longer grows in the horizontal direction, and thus, grows in the vertical direction, indicated by arrow AR3. As a result, the group III nitride crystal 3d becomes of a layer form, and substantially and nominally forms the group III nitride crystal layer 3. In the case where sapphire where a predetermined off angle θ is provided to the (0001) surface is used as the base 1, threading dislocations d2 which originally run and extend approximately in the horizontal direction are concentrated in regions where group III nitride crystals 3c that grow from the points of different steps BP3 make contact with each other, and turns to grow from these regions in the vertical direction. Alternatively, combination and disappearance of dislocations d2 may occur during a corresponding process.

As a result, dislocation unevenly-distributed regions RE1 where many dislocations exist and low dislocation regions RE2 are formed in the group III nitride crystal layer 3. The dislocation unevenly-distributed regions RE1 are considered to exist at intervals which are approximately the same as those of the steps existing in the epitaxial substrate 10 on the basis of the formation process. And it can be said that the ratio of occupation by the dislocation unevenly-distributed region RE1 on the surface of the group III nitride crystal layer 3 is sufficiently small in comparison with the one by the low dislocation regions RE2. Accordingly, it is considered that the density of dislocations in the low dislocation regions RE2 represents the density of dislocations throughout the entirety of the group III nitride crystal layer 3. Such low dislocation regions are obtained with a density of as low as approximately $1 \times 10^7/cm^2$, and thus, the group III nitride crystal layer 3 is obtained as a crystal layer where sufficiently low dislocations are realized as a whole.

In particular, the manner of growth of the group III nitride crystal layer 3 shown in FIGS. 3B to 3D is a typical example of a case where a group III nitride crystal having low Al content, specifically, GaN, is grown. The higher the content of Al becomes, the higher the possibility of nuclei forming in the terrace portion, which is the middle portion of steps BP3, becomes, and the higher the possibility of dislocations running through the terrace portion also becomes. Accordingly, though the higher the content of Al becomes, the smaller the effects of reducing dislocations become, the effects of reducing dislocations in the vicinity of the steps still remain. At this time, gaps are, in some cases, created in the vicinity of the steps.

In addition, in the case where the group III nitride crystal layer 3 is grown so as to have a thickness of at least not less than 3 μm, the main surface 3S thereof is made of a continuous film. In addition, even in the case where the group III nitride crystal layer 3 includes Al, no pits are generated on the main surface 3S, and flatness is achieved to the extent that the ra value is not greater than 5 angstroms in 5-by 5-μm square region measured by an AFM. As a result, the properties of a variety of semiconductor devices having such a group III nitride crystal layer 3 as a functional layer are improved.

As described above, an upper layer is formed of a group III nitride, preferably AlN, on a base having an off angle, and after that, a heating process is carried out at a temperature of not less than 1500° C., preferably at a temperature of not less than 1600° C., and thereby, repeating steps which are larger than several atomic layers are provided to the surface of the upper layer, and thus obtained epitaxial substrate is used as a base substrate for growing a group III nitride crystal layer. As a result, a group III nitride crystal having excellent crystal quality can be obtained. Furthermore, a semiconductor device, having a group III nitride crystal with excellent crystal quality as a functional layer and excellent device properties, can be obtained.

EXAMPLES

In the following, inventive examples of the embodiments described above and a comparative example are shown.

Inventive Example 1

In Inventive Example 1, an epitaxial substrate 10 was obtained by forming a (0001) AlN layer as the upper layer 2 having a thickness of 1 μm on sapphire as the base 1 which is provided on off angle θ of 0.1° to the (0001) plane, under reduced pressure at a temperature of 1200° C. by a MOCVD process. A base nitride layer is inserted between the AlN layer and the base. The evaluation of the crystallinity of the AlN layer was as follows: the X-ray rocking curve FWHM for the (0002) plane was 60 seconds; and the X-ray rocking curve FWHM for the (10-12) plane was 1100 seconds. The dislocation density of the AlN layer was $2\times10^{10}/cm^2$. The X-ray rocking curve measurement was made using an open slit by an ω scan process. This is to measure the tilt component of crystal orientation fluctuations from the c-axis of AlN when the (0002) plane is used, and to principally measure the twist component of the crystal orientation fluctuations about the c-axis of AlN when the (10-12) plane is used. The surface roughness (ra) in a 5- by 5-μm square region by the AFM measurement was not more than 3 Å. Steps at the atomic level were observed in the AFM image.

Next, the epitaxial substrates 10 were placed in a predetermined position within a reaction chamber of a heat treatment furnace. A nitrogen gas was supplied into the reaction chamber while the reaction chamber was maintained at 1 atm, and heat treatment was performed. The heating process was performed for 20 hours, with a temperature of the base 1 of 1650° C.

The evaluation of the crystal quality of the AlN layer after the above-mentioned heat treatment was as follows: the X-ray rocking curve FWHM for the (0002) plane was 110 seconds; and the X-ray rocking curve FWHM for the (10-12) plane was 600 seconds. The dislocation density of the AlN layer was $2\times10^9/cm^2$. In the AFM image, steps of which the average height was 40 angstroms and the average period 5 μm could be clearly seen.

Furthermore, a GaN layer having a film thickness of 5 μm was formed on thus obtained epitaxial substrate 10 under atmospheric pressure at 1050° C. by a MOCVD process. Dislocation unevenly-distributed regions and low dislocation regions were confirmed in this GaN layer. The density of dislocations in the latter was $1\times10^7/cm^2$. In addition, in the AFM image, no steps could be seen on the surface of the GaN layer.

Inventive Example 2

An $Al_{0.2}Ga_{0.8}N$ layer having a film thickness of 5 μm was formed on an epitaxial substrate 10 which was obtained in the same manner as in Inventive Example 1, under atmospheric pressure at 1100° C. by a MOCVD process. Dislocation unevenly-distributed regions and low dislocation regions were confirmed in this $Al_{0.2}Ga_{0.8}N$ layer. The density of dislocations in the latter was $2\times10^8/cm^2$. In addition, in the AFM image, no steps could be seen on the surface of the GaN layer.

Comparative Example

The same processes as those in Inventive Example 1 were carried out, except that the heating process after the formation of the upper layer 2 was omitted. Dislocation unevenly-distributed regions and low dislocation regions were confirmed in the obtained GaN layer, in the same manner as in the case of the examples, though the density of dislocations in the latter was $5\times10^7/cm^2$.

That is, it can be said that dislocations are reduced in GaN layers formed on an epitaxial substrate on which a heating process has been performed in advance, like in the Inventive examples, in comparison with cases where no heating process is carried out.

While the invention has been shown and described in detail, the foregoing description is in all aspects illustrative and not restrictive. It is therefore understood that numerous modifications and variations can be devised without departing from the scope of the invention.

What is claimed is:

1. An epitaxial substrate comprising:
   a base with at least one predetermined off angle step on a main surface, a surface of each step being a C plane of a substance constituting the base; and
   an upper layer made of a first group III nitride crystal and formed on said main surface at a predetermined temperature for formation,
   wherein said epitaxial substrate is processed through heating at a heating temperature which is higher than said temperature for formation after the formation of said upper layer,
   wherein said heating temperature is not lower than 1500° C., and
   wherein a height of periodical steps of the surface of said upper layer after said heating is larger than a height of periodical steps of the surface of said base.

2. The epitaxial substrate according to claim 1, wherein said first group-III nitride crystal has a main surface substantially coincident with a (0001) plane.

3. The epitaxial substrate according to claim 1, wherein said first group-III nitride crystal has an Al content of not less than 80 mole percent of all of the group-III elements.

4. The epitaxial substrate according to claim 3, wherein said first group III nitride crystal is AlN.

5. A semiconductor device comprising:
   a) an epitaxial substrate including:
      a-1) a base with at least one predetermined off angle step on a main surface, a surface of each step being a C plane of a substance constituting the base; and
      a-2) an upper layer made of a first group III nitride crystal and formed on said main surface at a predetermined temperature for formation, wherein
      said epitaxial substrate is processed through heating at a heating temperature which is higher than said temperature for formation after the formation of said upper layer; and
   b) at least one functional layer made of a second group III nitride and formed on said epitaxial substrate, wherein said at least one functional layer is a layer in which a function of said semiconductor device is implemented, wherein said heating temperature is not lower than 1500° C., and wherein a height of periodical steps of the surface of said upper layer after said heating is larger than a height of periodical steps of the surface of said base.

6. A method of manufacturing an epitaxial substrate, comprising the steps of:
   a) epitaxially forming an upper layer of a first group III nitride crystal on a main surface of a base with at least one predetermined off angle step on the main surface at a predetermined temperature for formation, a surface of each step being a C plane of a substance constituting the base; and
   b) heating said base together with said upper layer at a heating temperature which is higher than said temperature for formation after the formation of said upper layer, wherein said heating temperature is not lower than 1500° C., and wherein a height of periodical steps of the surface of said upper layer after said heating is larger than a height of periodical steps of the surface of said base.

7. A method for unevenly distributing dislocations in a group III nitride crystal, comprising the steps of:
   a) preparing an epitaxial substrate where an upper layer is epitaxially formed of a first group III nitride crystal at a predetermined temperature for formation on a main surface of a base with at least one predetermined off angle step on the main surface, a surface of each step being a C plane of a substance constituting the base;
   b) heating said epitaxial substrate at a heating temperature which is higher than said temperature for formation; and
   c) epitaxially forming a group III nitride crystal of a second group III nitride on said epitaxial substrate, wherein said heating temperature is not lower than 1500° C., and wherein a height of periodical steps of the surface of said upper layer after said heating is larger than a height of periodical steps of the surface of said base.

* * * * *